US011383601B2

(12) United States Patent
Maier

(10) Patent No.: US 11,383,601 B2
(45) Date of Patent: Jul. 12, 2022

(54) VEHICLE WITH SMART TOUCH

(71) Applicant: FM MARKETING GMBH, Neumarkt am Wallersee (AT)

(72) Inventor: Ferdinand Maier, Neumarkt am Wallersee (AT)

(73) Assignee: FM MARKETING GMBH, Neumarkt am Wallersee (AT)

( * ) Notice: Subject to any disclaimer, the term of this patent is extended or adjusted under 35 U.S.C. 154(b) by 366 days.

(21) Appl. No.: 16/495,801

(22) PCT Filed: Mar. 22, 2018

(86) PCT No.: PCT/EP2018/057291
§ 371 (c)(1),
(2) Date: Sep. 19, 2019

(87) PCT Pub. No.: WO2018/172456
PCT Pub. Date: Sep. 27, 2018

(65) Prior Publication Data
US 2020/0064949 A1 Feb. 27, 2020

(30) Foreign Application Priority Data
Mar. 22, 2017 (DE) .......................... 102017106212.2

(51) Int. Cl.
*G06F 3/044* (2006.01)
*B60K 37/06* (2006.01)
(Continued)

(52) U.S. Cl.
CPC .............. *B60K 37/06* (2013.01); *G06F 3/016* (2013.01); *G06F 3/044* (2013.01); *G06F 3/0482* (2013.01); *B60K 2370/11* (2019.05);
*B60K 2370/111* (2019.05); *B60K 2370/113* (2019.05); *B60K 2370/115* (2019.05); *B60K 2370/119* (2019.05);
(Continued)

(58) Field of Classification Search
CPC ....... G06F 3/044; G06F 3/0482; B60K 37/06; B60K 2370/113; B60K 2370/143; B60K 2370/158
See application file for complete search history.

(56) References Cited

U.S. PATENT DOCUMENTS

2005/0024342 A1* 2/2005 Young ................ B60K 35/00
345/173
2005/0177287 A1* 8/2005 Wang ................ B60K 37/06
700/83
(Continued)

*Primary Examiner* — Andrea C Leggett
(74) *Attorney, Agent, or Firm* — Dragon Sun Law Firm, PC; Jinggao Li, Esq.; Nathaniel Perkins

(57) ABSTRACT

A vehicle including a chassis which is supported on wheels such that it can be driven in a direction of travel for carrying a driver, a steering element for the driver to specify the direction of travel, a reproduction element which is arranged in the field of view of the driver in front of the driver when viewed in the direction of travel, and which is designed to display a menu containing a number of menu elements which are arranged to form a grid, and an input interface including a pressure plate which is arranged on the steering element including a top side and a bottom side which is situated opposite the top side, wherein a number of segments which are arranged to form the grid and can be detected in a haptic manner are formed on the top side of the pressure plate.

14 Claims, 5 Drawing Sheets

(51) Int. Cl.
*G06F 3/01* (2006.01)
*G06F 3/0482* (2013.01)
(52) U.S. Cl.
CPC .. *B60K 2370/128* (2019.05); *B60K 2370/143* (2019.05); *B60K 2370/152* (2019.05); *B60K 2370/158* (2019.05); *B60K 2370/1529* (2019.05); *B60K 2370/164* (2019.05); *B60K 2370/191* (2019.05)

(56) References Cited

U.S. PATENT DOCUMENTS

| | | | | |
|---|---|---|---|---|
| 2007/0273657 | A1* | 11/2007 | Oki | G06F 3/0238 345/172 |
| 2015/0344059 | A1* | 12/2015 | Kim | B60K 35/00 74/552 |
| 2016/0034771 | A1* | 2/2016 | Schamp | B60G 17/019 348/148 |
| 2017/0038775 | A1* | 2/2017 | Park | G05D 1/0088 |
| 2019/0009676 | A1* | 1/2019 | Yokota | G06F 3/0484 |
| 2019/0300014 | A1* | 10/2019 | Nagase | B60K 35/00 |

* cited by examiner

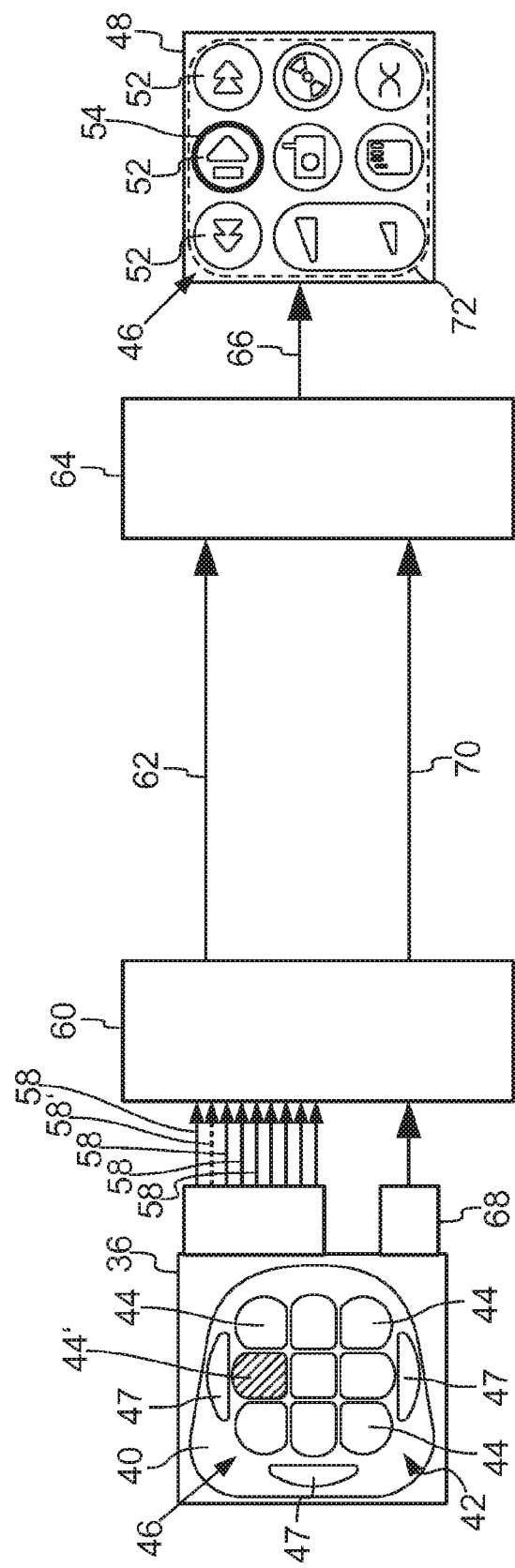

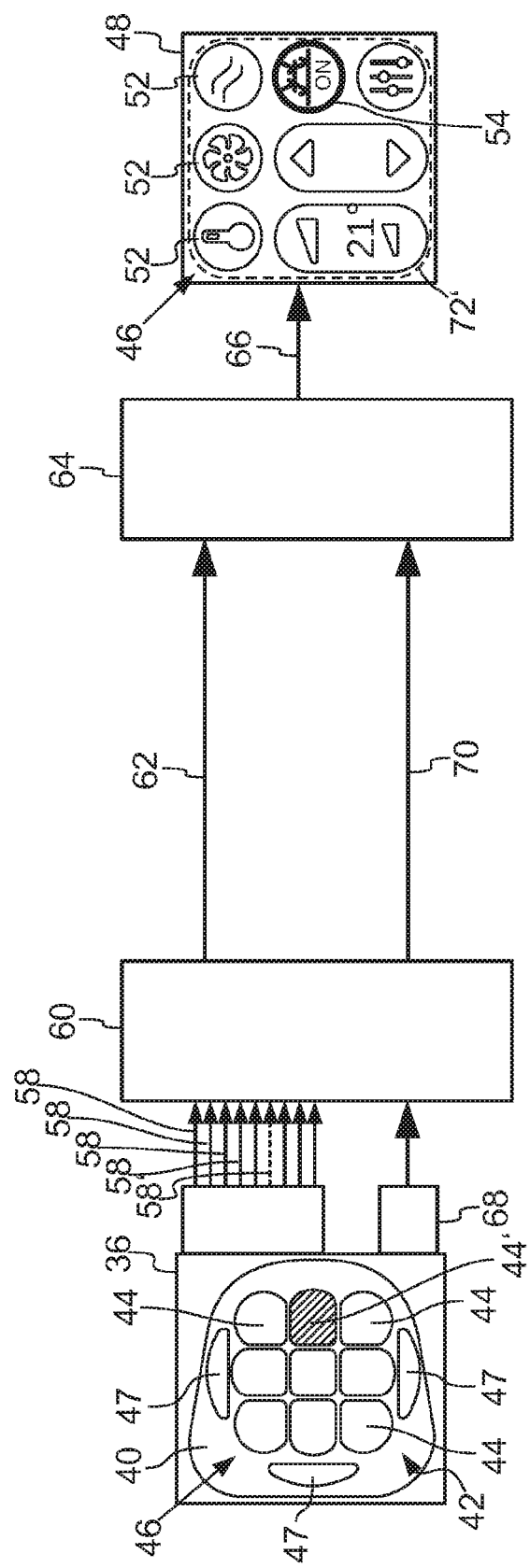

VEHICLE WITH SMART TOUCH

TECHNICAL FIELD

The present invention relates to a vehicle and a method to control a menu on playback equipment in a vehicle.

A vehicle is known from US 2014/0172186 A1 including a steering wheel assembly with various buttons for actuating various functions in the vehicle. The driver may have the function displayed on a head-up display by touching the buttons and have it executed by pressing the buttons. A visual interaction with the buttons is not required.

It is the object of the invention to improve the operation.

BACKGROUND

In accordance with one aspect of the invention, a vehicle comprises a chassis which is supported on wheels such that it can be driven in a direction of travel for carrying a driver, a steering element for the driver to specify the direction of travel, a reproduction element which is arranged in the field of view of the driver in front of the driver when viewed in the direction of travel, and which is designed to display a menu containing a number of menu elements which are arranged to form a grid and an input interface comprising a pressure plate which is arranged on the steering element comprising a top side and a bottom side which is situated opposite the top side, wherein a number of segments which are arranged to form the grid and can be detected in a haptic manner are formed on the top side of the pressure plate, and wherein the number of the menu elements corresponds to the number of segments which can be detected in a haptic manner, so that one segment which can be detected in a haptic manner on the pressure plate is assigned to each menu element of the menu.

The cited vehicle is based on the idea that a menu sequence, for example on smartphones, is visually very interaction-intensive for the driver. The driver must constantly check which menu item he or she wants to select before he or she can actually make the selection on the menu item. This makes menu navigation while driving a vehicle extremely risky and virtually impossible for any driver participating carefully and mindfully in road traffic.

The cited vehicle is based on the idea of projecting the menu to the driver for menu navigation in a visual range in which he or she can keep an eye on the traffic at the same time. This can be on a navigation device, on a dashboard or on a head-up display, for example. The menu to be navigated and the input element used to control the menu are linked in such a way that the driver finds their way in the menu through haptic feeling on the one hand and intuitive action on the other hand. The driver can thus trace and control the menu within the visual range of the traffic without the need to see their fingers when he or she navigates through the menus. The driver is no longer distracted, which makes a significant contribution to road safety. With more than 50,000 estimated traffic accidents caused by smartphones on German roads alone, the increase in safety with the cited vehicle is obvious.

ASPECTS

The vehicle can be of any design, for example a passenger car, motorcycle, bicycle, truck or in any other way.

In a further embodiment of the cited vehicle, the steering element comprises a handle area wherein the pressure plate is arranged in an area on the steering element which can be reached with the driver's thumb if he or she holds the handle element with their other fingers. In this way, the driver can operate the menu without taking their hands from the steering wheel.

In another embodiment of the cited vehicle, the segments which can be detected in a haptic manner are depressions provided in the top side of the pressure plate. Compared to convex buttons, depressions have the advantage of providing a larger contact surface for the driver's fingers, and are thus easier to perceive haptically.

In a special embodiment of the cited vehicle, the depressions may substantially have the design of a ball segment providing the biggest haptic contact surface between the finger of the driver and the haptically perceptible segment.

In another particular embodiment of the cited vehicle, the grid is a Cartesian grid, as, for example, can be found on current smartphones.

In a further embodiment, the cited vehicle comprises a sensor arranged at the bottom side of the pressure plate being set up to transmit a button selection signal to the reproduction element in response to the position of the finger on the top side of the pressure plate. In this way, the position of the finger can be detected in the most cost-effective and fail-safe way.

In an additional embodiment of the cited vehicle, the pressure plate is movably mounted in a direction vertical to the top side and bottom side, wherein a pressure button is arranged on the bottom side of the pressure plate to generate a button activation signal with its pressure. In this way, the activation process of a menu element can be realized with a single button which means it is possible to design the input interface in the cited vehicle in a particularly compact and space-saving manner.

In accordance with a further aspect of the invention, a method to control a menu on a reproduction element of one of the cited vehicles comprises the steps: Receiving a position signal which depends on the position of a finger of the driver on the button, Highlighting the menu element which is assigned to the haptically perceivable segment which is at the position of the finger, and Triggering a function assigned to the highlighted menu element when the pressure plate is activated.

According to a further aspect of the invention, a control device is set up to implement one of the stated methods.

In a further refinement of the cited device, the cited device has a memory and a processor. The cited method is saved in the memory in the form of a computer program, and the processor is provided for executing the method when the computer program is loaded from the memory into the processor.

According to a further aspect of the invention, a computer program comprises program coders for executing all the steps of the cited method when the computer program is executed on a computer or one of the cited devices.

According to another aspect of the invention, a computer program product contains a program code which is saved on a computer-readable data carrier and which carries out the cited method when it is executed on a data processing device.

BRIEF DESCRIPTION OF THE DRAWINGS

The above-described properties, features and advantages of this invention, as well as the manner in which they are achieved, will become clearer in connection with the following description of the embodiments, which are described in more detail in connection with the drawing, in which:

FIG. 4 is a schematic representation of an input interface which is connected to a screen in the cockpit of FIG. 2 in a second condition; and FIG. 5 is a schematic representation of an input interface which is connected to a screen in the cockpit of FIG. 2 in a third condition;

DETAILED DESCRIPTION

Figure 1:
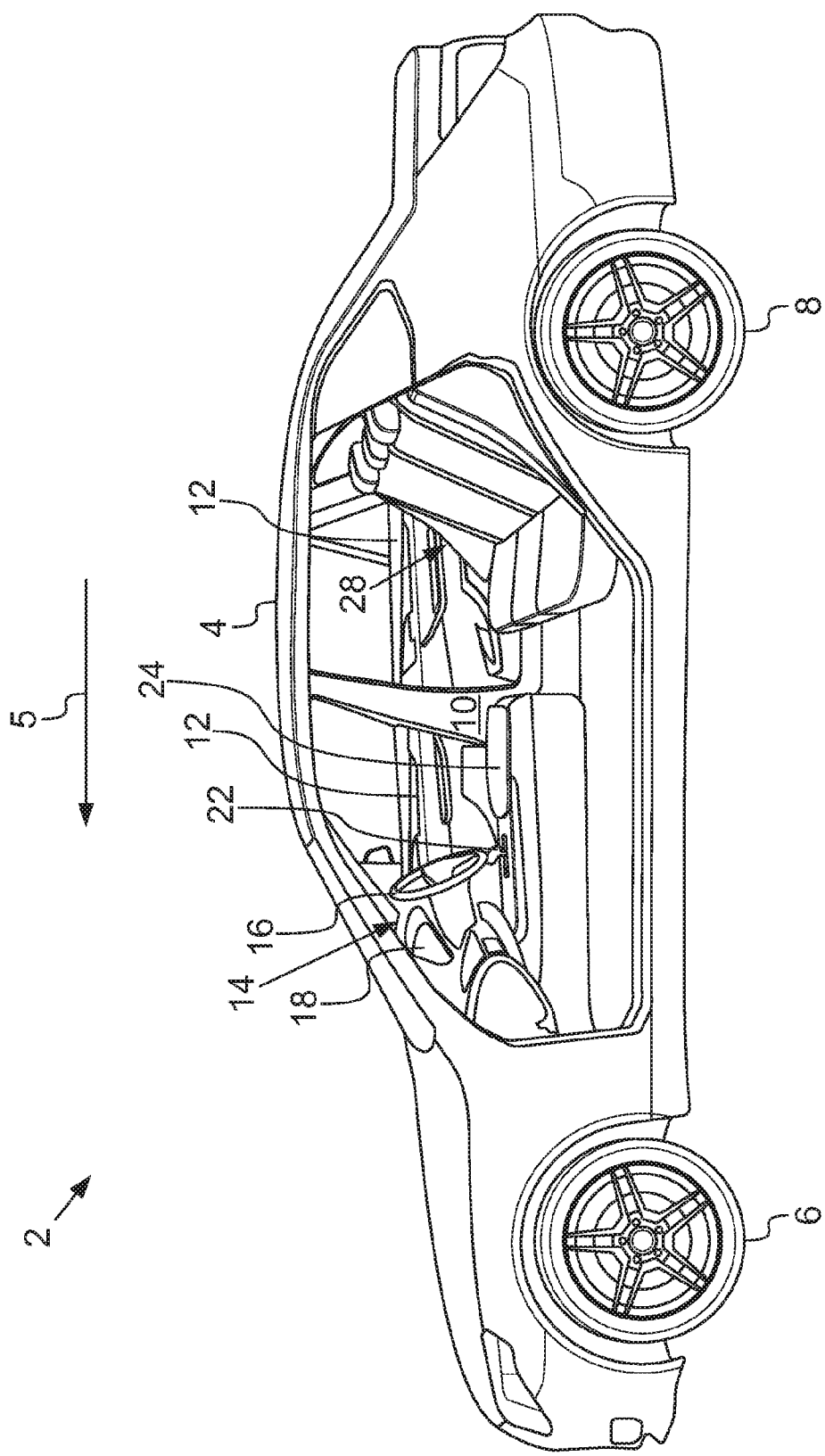
FIG. 1 is a schematic representation of a vehicle.

In the drawings, the same technical elements are provided with the same reference signs, and are only described once. The drawings are purely schematic, and, in particular, do not reflect the actual geometric proportions.

Reference is made to FIG. 1 showing a side view partially displayed vehicle 2. The vehicle 2 comprises a chassis 4 which is supported on wheels 6, 8 such that it can be driven in a direction of travel 5. One front wheel 6 and one rear wheel 8 of these wheels 6, 8 can be seen in FIG. 1.

The chassis 4 forms the boundaries of a passenger compartment 10 which can be opened and closed by doors 12. In order to look into the passenger compartment 10, the doors 12 which are installed on the vehicle and directed towards the observe are not displayed in FIG. 1.

The passenger compartment 10 contains a cockpit 14, in which a steering wheel 16 as a steering element for turning the front wheels 6 to change the direction of travel 5 and a dashboard 18 are arranged for displaying various relevant information on the status of the vehicle 2, for example its speed, to a driver. Below the cockpit 14 there is an accelerator pedal which is not shown in any further detail to accelerate the vehicle 2, a brake pedal which is not shown here to brake the vehicle 2, and a gear selector 22 to select a gear in the transmission of the vehicle 22 which is not shown in any further detail.

As well as the doors 12 facing the observer, FIG. 1 also does not show a driver's seat and a passenger's seat, both separated by a center console 24. Furthermore, in direction of travel 5 there is a back seat 28 behind the driver's seat and the passenger's seat.

Figure 2:
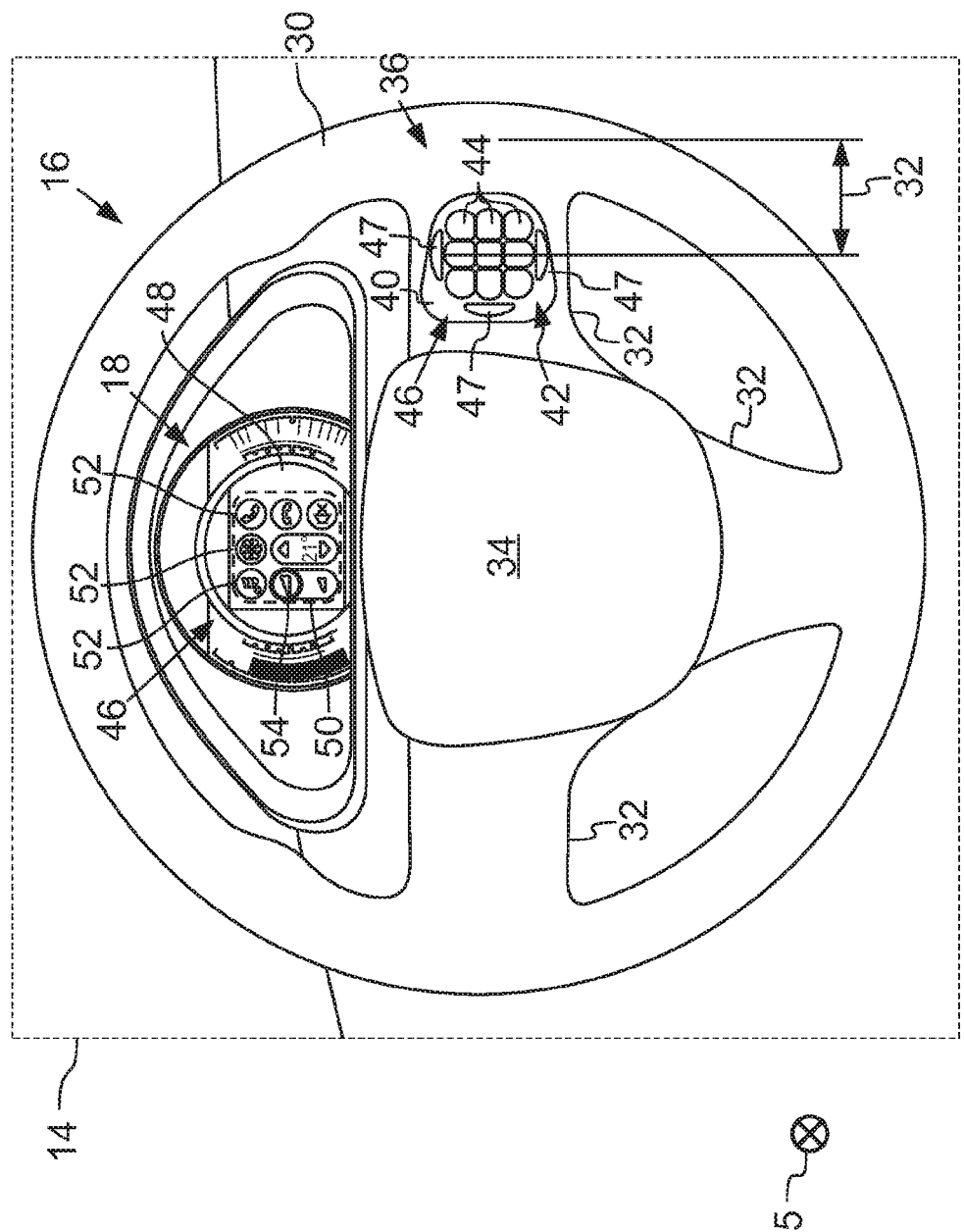
FIG. 2 is a schematic representation of a cockpit in a vehicle of FIG. 1.

Reference is made to FIG. 2, which shows an example of the cockpit 14 from behind when viewed in direction of travel 5.

The steering wheel 16 has a grip area 30 where the driver can grip the steering wheel 16 and turn it to turn the front wheels 6. Radially within the grip area there is an airbag housing 34 in which a non-visible airbag is arranged to protect the driver against impact. Such an impact protection function is well known, which is why a more detailed explanation will not be given below.

The airbag housing 34 is fixed to a steering column not shown here. In this way, a torque exerted by the driver on the grip area can be transmitted to the steering column to turn the steering column. In a manner known per se, the turning of the steering column causes the front wheels 6 to turn, which also shall not be described in any further detail.

An input interface 36 is arranged on one of the struts 32 between the grip area 30 and the airbag housing 34. The input interface 36 is positioned on the strut 32 at a distance from the grip area in such a way that the driver, holding the grip area with their hand, can reach the input interface 36 with their thumbs.

The input interface 36 comprises a pressure plate 40, on whose top side 42 when viewed in the direction of travel 5 segments in the shape of depressions 44 which can be detected in a haptic manner are arranged in a grid. The input interface 36 comprises additional pressure plates 47 which can be operated independently of the pressure plate 40.

The driver can move their thumb over the individual depressions 44 on the grid 46 and feel them in this way. At the same time, a highlighted menu 50 with menu elements 52 surrounded by a dotted line in FIG. 2 is displayed on a screen 48 in the dashboard 18, with the menu elements 52 arranged in the same grid 46 as the grid 46 on the pressure plate 40 of the input interface 36.

Whenever the driver moves their thumb over the pressure plate 40, he or she sees where their thumb is on the pressure plate 40 by the highlighted 52 menu elements 52. The driver then selects the desired menu element by pressing the pressure plate 40 on the depression 44 of a desired menu item 52. Due to the haptic feedback via the depressions 44, the driver learns to operate the menu 50 intuitively, and ideally no longer needs any visual interaction with the menu 50 at all. In this case, the menu 50 is in the direction of travel 5 when being operated, so that the driver does not have to lose sight of the traffic while driving.

Figure 3:
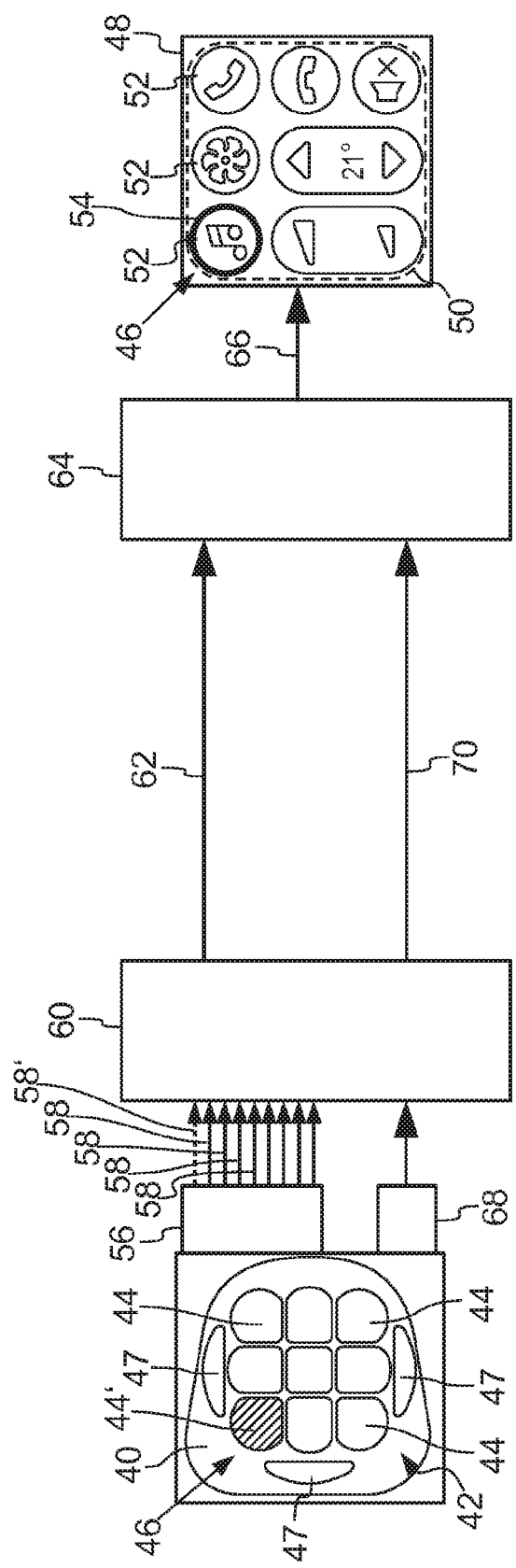
FIG. 3 is a schematic representation of an input interface which is connected to a screen in the cockpit of FIG. 2 in a first condition.

The operation of the menu using the pressure plate shall be explained in more detail by means of FIGS. 3 to 5.

In the present embodiment, the highlighting 54 is generated by a capacitive sensor 56 indicated schematically in FIGS. 3 to 5, which is arranged on a bottom side of the pressure plate 40 opposite the top side 42 and not visible in the figures. The capacitive sensor 56 comprises a plurality of capacitor plates which are not shown here, with one of such capacitor plates positioned underneath every depression 44 on the bottom side of the pressure plate 40. An evaluation line 58 is connected to each capacitor plate in a manner known per se. Not all these evaluation lines 58 are given reference signs in FIGS. 3 to 5. Each capacitor plate is galvanically isolated to from its evaluation line 58.

In an idle state, each capacitor plate has a basic capacitance compared to its evaluation line 58. If the driver moves their thumb over the depression 44 which is executed above the corresponding capacitor plate on the top side of the pressure plate 40, the capacitance of the corresponding capacitor plate changes compared to its assigned evaluation line 58. In FIG. 3, one of the depression with the reference sign 44' is crosshatched to indicate that the user has placed their thumb on it. For reasons of clear explanations, in the following crosshatched depressions 44' shall therefore refer to depressions 44 on which the driver has placed their thumb.

All evaluation lines 58 are connected to an evaluation and transmission device 60. Each evaluation line 58 carries a signal with a signal level that depends on whether the driver's thumb is placed on the corresponding depression 44 or not. Evaluation lines 58 on which there is a signal level corresponding to the basic capacitance without the thumb of the driver placed on the corresponding depression 44 are shown in FIGS. 3 to 5 with solid lines. Evaluation lines on which there is a signal level corresponding to a capacitance with the thumb of the driver placed on the corresponding depression 44 are shown in FIGS. 3 to 5 with dashed lines. For reasons of clarity such evaluation lines have the reference sign 58'.

The evaluation and transmission device 60 evaluates the signal levels on the evaluation lines 58 and determines, whether and on which depression 44 the driver has placed their finger. The evaluation and transmission device 60 uses this information to generate a position signal 62 which it transmits via a cable in the vehicle 2 to a control device 64. However, transmission can also be wireless.

The control device 64 generates an image signal 66. Based on this image signal 66, the menu 50 with its menu items 52 is displayed on the screen 48. Based on the position signal 62, the control device 64 then controls the screen 48 in such a way that the menu item 52 being positioned in the grid 46 at the same place as the depression 44' contacted with the thumb is highlighted with the highlighting 54. In this way, the driver can perceive where their thumb is on the pressure plate 40.

If the driver wants to activate a function linked to the menu item 52 highlighted by highlighting 54, the driver presses the pressure plate 40 with their thumb into the steering wheel 16. On the bottom side of the pressure plate 40, next to the capacitive sensor 56, there is a pushbutton 68 which is also indicated in FIG. 3 only as a schematic representation. If the pushbutton 68 is activated by means of the pressure of the pressure plate 40, the evaluation and transmission device 60 transmits a trigger signal 70 to the control device 64, which then activated the switching of further elements in the vehicle 2 which are connected to the previously mentioned linked function. In FIG. 3, this linked function, for example, is the opening of an audio playback program.

FIG. 4 shows the corresponding sub-menu 72. Here, for example, the driver selects a reproduction function, with which the playback of a piece of music is started.

FIG. 5 shows an alternative sub-menu 72' to control the air conditioning in the vehicle 2.

The invention claimed is:

1. A vehicle (2) comprising:
   a chassis (4) which is supported on wheels (6, 8) such that it can be driven in a direction of travel (5) for carrying a driver;
   a steering element (16) for the driver to specify the direction of travel (6) comprising a grip area (30);
   a reproduction element (48) which is arranged in the field of view of the driver in front of said driver when viewed in the direction of travel, and which is designed to display a menu (50) containing a number of menu elements (52) which are arranged to form a grid (46), and
   an input interface (36) comprising a pressure plate (40) which is arranged on the steering element (16) comprising a top side (42) and a bottom side which is situated opposite the top side (42), wherein a number of segments (44) which are arranged to form the grid (46) and can be detected in a haptic manner are formed on the top side (42) of the pressure plate (40), and wherein a number of the menu elements (52) corresponds to the number of segments (44) which can be detected in a haptic manner, so that one segment (44), which can be detected in a haptic manner, on the pressure plate (40) is assigned to each menu element (52) of the menu (50),
   wherein the driver can move their thumb over the number of segments (44) on the grid (46); at the same time, the highlighted menu (50) with menu elements (52) is displayed on the reproduction element (48) in a dashboard (18), with the menu elements (52) arranged in the same grid (46) as the grid (46) on the pressure plate (40) of the input interface (36);
   wherein the input interface (36) comprises at least three pressure plates (47) which surround the grid (46) and can be operated independently of the pressure plate (40); and
   wherein the highlighted menu (50) comprises a highlighting (54) that is generated by a capacitive sensor (56) arranged on a bottom side of the pressure plate (40) opposite the top side (42), thereby the driver learning to operate the menu (50) intuitively, and no longer needing any visual interaction with the menu (50) with haptic feedback via the depressions (44).

2. The vehicle (2) according to claim 1 wherein the steering element (16) comprises a handle area (30), and wherein the pressure plate (40) is arranged in an area (32) on the steering element (16) which can be reached with a thumb of the driver if he or she holds the handle element (30) with their other fingers.

3. The vehicle (2) according to claim 1, wherein segments (44) which can be detected in a haptic manner are depressions (44) embedded in the top side (42) of the pressure plate (40).

4. The vehicle (2) according to claim 3, wherein the depressions (44) are substantially executed in the shape of ball segments.

5. The vehicle (2) according to claim 4, further comprising:
   an airbag housing (34) disposed in a middle of the steering element (16),
   wherein the dashboard (18) is arranged for displaying a status of the vehicle (2) which can be viewed by the driver through the steering element (16) along a direction of travel (5); and
   wherein the input interface (36) is arranged on a right side of two symmetrically distributed struts (32), disposed between the handle area (30) and the airbag housing (34), and positioned on the strut (32) at a distance from the handle area (30) in such a way that the driver, holding the handle area (30) with their hand, can reach the input interface (36) with their thumbs.

6. The vehicle (2) according to claim 5, wherein the grid (46) on the menu elements (52) of the dashboard (18) and the grid (46) on the pressure plate (40) of the input interface (36) form a Cartesian grid with a 3-grid by 3-grid matrix.

7. The vehicle (2) according to claim 1, wherein the grid (46) is a Cartesian grid.

8. The vehicle (2) according to claim 1, wherein the pressure plate (40) is movably mounted in a direction vertical to the top side (42) and bottom side, wherein a pressure button (68) is arranged on the bottom side of the pressure plate to generate a button activation signal (70) with its pressure.

9. A method to control a menu (50) on a reproduction element (48) of a vehicle (2), comprising a chassis (4) which is supported on wheels (6, 8) such that it can be driven in a direction of travel (5) for carrying a driver, a steering element (16) for the driver to specify the direction of travel (6), a reproduction element (48) which is arranged in the field of view of the driver in front of said driver when viewed in the direction of travel, and which is designed to display a menu (50) containing a number of menu elements (52) which are arranged to form a grid, an input interface (36) comprising a pressure plate (40) which is arranged on the steering element (16) comprising a top side (42) and a bottom side which is situated opposite the top side (42), wherein a number of segments (44) which are arranged to form the grid (46) and can be detected in a haptic manner are formed on the top side (42) of the pressure plate (40), and wherein the number of the menu elements (52) corresponds to the number of segments (44) which can be detected in a haptic manner, so that one segment (44), which can be detected in a haptic manner, on the pressure plate (40) is assigned to each menu element (52) of the menu (50), the method comprising:

receiving a position signal (62) which depends on the position of a finger of a driver on the pressure plate (40), highlighting the menu element (52) which is assigned to the segment (44) which can be detected in a haptic manner and which is at the position of the finger, and triggering a function which is assigned to the highlighted menu element (52) when the pressure plate (40) is activated, wherein the driver can move their thumb over the number of segments (44) on the grid (46); at the same time, the highlighted menu (50) with menu elements (52) is displayed on the reproduction element (48) in a dashboard (18), with the menu elements (52) arranged in the same grid (46) as the grid (46) on the pressure plate (40) of the input interface (36);

wherein the input interface (36) comprises at least three pressure plates (47) which surround the grid (46) and can be operated independently of the pressure plate (40); and wherein the highlighted menu (50) comprises a highlighting (54) that is generated by a capacitive sensor (56) arranged on a bottom side of the pressure plate (40) opposite the top side (42), thereby the driver learning to operate the menu (50) intuitively, and no longer needing any visual interaction with the menu (50) with haptic feedback via the depressions (44).

10. The method of claim 9, wherein the vehicle (2) further comprises:

an airbag housing (34) disposed in a middle of the steering element (16), wherein the reproduction element (48) is arranged for displaying a status of the vehicle (2) which can be viewed by the driver through the steering element (16) along a direction of travel (5); and wherein the input interface (36) is arranged on a right side of two symmetrically distributed struts (32), disposed between the handle area (30) and the airbag housing (34), and positioned on the strut (32) at a distance from the handle area (30) in such a way that the driver, holding the handle area (30) with their hand, can reach the input interface (36) with their thumbs.

11. The method of claim 9, wherein the grid (46) on the menu elements (52) of the dashboard (18) and the grid (46) on the pressure plate (40) of the input interface (36) form a Cartesian grid with a 3-grid by 3-grid matrix.

12. A control device (60) for a vehicle comprising a chassis (4) which is supported on wheels (6, 8) such that it can be driven in a direction of travel (5) for carrying a driver, a steering element (16) for the driver to specify the direction of travel (6), a reproduction element (48) which is arranged in the field of view of the driver in front of said driver when viewed in the direction of travel, and which is designed to display a menu (50) containing a number of menu elements (52) which are arranged to form a grid, an input interface (36) comprising a pressure plate (40) which is arranged on the steering element (16) comprising a top side (42) and a bottom side which is situated opposite the top side (42), wherein a number of segments (44) which are arranged to form the grid (46) and can be detected in a haptic manner are formed on the top side (42) of the pressure plate (40), and wherein the number of the menu elements (52) corresponds to the number of segments (44) which can be detected in a haptic manner, so that one segment (44), which can be detected in a haptic manner, on the pressure plate (40) is assigned to each menu element (52) of the menu (50), the control device having a processing system which is configured to:

receive a position signal (62) which depends on the position of a finger of a driver on the pressure plate (40);

highlight the menu element (52) which is assigned to the segment (44) which can be detected in a haptic manner and which is at the position of the finger; and trigger a function which is assigned to the highlighted menu element (52) when the pressure plate (40) is activated, wherein the driver can move their thumb over the number of segments (44) on the grid (46); at the same time, a highlighted menu (50) with menu elements (52) is displayed on the reproduction element (48) in a dashboard (18), with the menu elements (52) arranged in the same grid (46) as the grid (46) on the pressure plate (40) of the input interface (36);

wherein the input interface (36) comprises at least three pressure plates (47) which surround the grid (46) and can be operated independently of the pressure plate (40); and wherein the highlighted menu (50) comprises a highlighting (54) that is generated by a capacitive sensor (56) arranged on a bottom side of the pressure plate (40) opposite the top side (42), thereby the driver learning to operate the menu (50) intuitively, and no longer needing any visual interaction with the menu (50) with haptic feedback via the depressions (44).

13. The control device (60) of claim 12, wherein the vehicle (2) further comprises:

an airbag housing (34) disposed in a middle of the steering element (16), wherein the dashboard (18) is arranged for displaying a status of the vehicle (2) which can be viewed by the driver through the steering element (16) along a direction of travel 5; and wherein the input interface (36) is arranged on a right side of two symmetrically distributed struts (32), disposed between the handle area (30) and the airbag housing (34), and positioned on the strut (32) at a distance from the handle area (30) in such a way that the driver, holding the handle area (30) with their hand, can reach the input interface (36) with their thumbs.

14. The control device (60) of claim 12, wherein the grid (46) on the menu elements (52) of the dashboard (18) and the grid (46) on the pressure plate (40) of the input interface (36) form a Cartesian grid with a 3-grid by 3-grid matrix.

* * * * *